(12) United States Patent
Bianchessi et al.

(10) Patent No.: US 6,169,507 B1
(45) Date of Patent: Jan. 2, 2001

(54) STABILIZATION OF SINGLE LOOP SIGMA-DELTA MODULATORS OF A HIGH ORDER

(75) Inventors: Marco Bianchessi, Melzo; Sandro Dalle Feste, Novara; Nadia Serina, Castelcovati; Marco Angelici, Galliate Lombardo; Fabio Osnato, Milan, all of (IT)

(73) Assignee: STMicroelectronics S.r.l., Agrate Brianza (IT)

( * ) Notice: Under 35 U.S.C. 154(b), the term of this patent shall be extended for 0 days.

(21) Appl. No.: 09/277,874

(22) Filed: Mar. 29, 1999

(30) Foreign Application Priority Data

Apr. 3, 1998 (EP) .................................................. 98830207

(51) Int. Cl.$^7$ ..................................................... H03M 3/02
(52) U.S. Cl. ........................... 341/143; 341/143; 330/207
(58) Field of Search .................................... 341/143, 157, 341/118, 200, 166, 168, 155; 330/207

(56) References Cited

U.S. PATENT DOCUMENTS

| 4,987,416 | | 1/1991 | Leslie . | |
|---|---|---|---|---|
| 5,187,482 | * | 2/1993 | Tiemann et al. | 341/143 |
| 5,208,594 | * | 5/1993 | Yamazaki | 341/143 |
| 5,777,512 | * | 7/1998 | Tripathi et al. | 330/207 A |

FOREIGN PATENT DOCUMENTS 95 34955   12/1995 (WO) ............................. H03M 3/02

* cited by examiner

*Primary Examiner*—Brian Young
*Assistant Examiner*—John Nguyen
(74) *Attorney, Agent, or Firm*—Theodore E. Galanthay; Allen, Dyer, Doppelt, Milbrath & Gilchrist, P.A.

(57) ABSTRACT

A sigma-delta modulator of second or higher order includes two or more integrating stages, and a comparator connected in cascade to the integration stages. A signal having a logic level +1 is generated when an input signal to the sigma-delta modulator is positive, and a signal having a logic value −1 is generated when the input signal is negative. Regardless of its absolute value, a feedback line includes a low-pass filter and an adder circuit for adding a feedback signal. The signal output by the last of the integrating stages is filtered by the low-pass filter. The sigma-delta modulator further includes a second comparator having an input connected in common to the input of the first comparator and an output connected to an input of the low-pass filter. The second comparator outputs a logic signal having a positive value when the input signal is positive, and outputs a logic signal having a negative value when the input signal is negative. The second comparator also outputs a signal having an increasing logic level when the input signal exceeds one or more predefined thresholds of increasing value.

23 Claims, 2 Drawing Sheets

STABILIZATION OF SINGLE LOOP SIGMA-DELTA MODULATORS OF A HIGH ORDER

FIELD OF THE INVENTION

The present invention relates to the field of digital-to-analog and analog-to-digital signal converters, and, more particularly, to a sigma-delta modulator used in such converters.

BACKGROUND OF THE INVENTION

Sigma-delta modulators used in digital/analog and analog/digital converters, and particularly those of high order ($\leq 2$) are likely to have instability problems which should be accurately checked. A sigma-delta modulator may be represented as in FIG. 1. The function of such a structure is that of reducing the precision of the digital input signal (IN) without changing the quality of the signal. This is done by using a quantizer that eliminates some of the precision bits while a feedback block keeps the noise introduced by the quantizer in a frequency band different from the frequency band of the signal.

In an extreme case, the quantizer reduces the signal to one bit, so that the function may be implemented with a simple comparator. A thorough analysis of the performance of the system shown in FIG. 1 cannot be done by using the normal techniques that are used for analyzing linear networks because of the presence of a nonlinear block, i.e., the quantizer. However, it is possible to linearly operate the modulator to obtain a model capable of providing qualitative indications of the system's behavior. To do this, the quantizer is modeled as an external source of noise "q" (i.e., white noise), thus eliminating any nonlinear block from the system, and thereafter, the output signal contribution of the input signal and of the added noise. The equivalent scheme becomes that shown in FIG. 2.

By solving the block diagram of FIG. 2, the following expression is obtained: Out(z)=In(Z)*[A(Z)/1−B(Z)]+q(Z)*[1/1−B(Z)]. The output is made up of the input signal filtered by the function [A(Z)/1−B(Z)] and of the noise filtered by the function [1/1−B(Z)]. By appropriately defining the two functions A(Z) and B(Z), it is possible to obtain the desired functions for both the input signal and for the noise.

To keep the signal and the noise separated in frequency, A(Z) and B(Z) are chosen so that the system operates as a low-pass filter for the signal and as a high-pass filter for the quantization noise. The performance of sigma-delta modulators increase with the order of the A(Z) and B(Z) functions, but problems arise for ensuring closed loop stability for orders $\leq 22$. The problem is more subtle than it may appear because the quantizer is a nonlinear block. In particular, it is even possible for the comparator to provide a certain gain. Such a gain primarily depends on the input signal amplitude. If the signal amplitude increases, this fictitious gain of the comparator decreases.

The stability of a feedback system is significantly conditioned by the open loop gain. For a certain interval of gain values, the stability is maintained while outside this interval the system becomes unstable. Usually, in the case of sigma-delta modulators, the system is such that excessively low gains introduce a state of instability. Consequently, an irreversible phenomena takes place. If for any reason the signal upstream of the comparator increases excessively, the gain of the comparator decreases. This in turn reduces the loop gain and the system becomes unstable. In such a state of instability, the internal signals increase and the system is prevented from regaining stability.

This type of phenomenon is very common in sigma-delta modulators, and to prevent this problem, there are different techniques ranging in varying complexity. The problem of instability arises rarely and only under particular conditions—typically at switch-on, and in the case of low frequency signals having large amplitudes. However, it is very important to return the system to a correct operation. Otherwise, the system will remain unstable even after the triggering conditions have ended and the sigma-delta modulator would stop functioning at the first critical signal.

Traditional approaches addressing these problems are based on the principle of recognizing the state of instability, and accordingly, intervening on the internal states to bring the system back to an operating point within the stability zone. These methods differ among each other on how the state of instability is detected and in the way the system is brought back to a correct operation.

These known approaches range from a simpler system that intervenes only when a register overflows by zeroing all the internal states, to more complex systems wherein critical situations are recognized before they degenerate into a real instability. Therefore, an intervention is limited to just an appropriate point without major consequences on the system as a whole.

SUMMARY OF THE INVENTION

A sigma-delta modulator in accordance with the invention becomes unconditionally stable using an internal modification rather than the addition of dedicated external control circuits. In operation, the sigma-delta modulator never exits the stability zone irrespective of the amplitude of the input signal. The comparator is required to provide as output a one bit signal for converting into an analog signal by the use of a simple electronic switch. Therefore, there is no need to have an output signal having a larger number of bits because this would require a more complex analog stage connected in cascade.

In contrast, with respect to the feedback, a multi-bit signal may be acceptable for the conventional architecture without creating substantial complications. Fundamentally, the sigma-delta modulater is based upon the use of two distinct comparators. A conventional one-bit comparator is dedicated for generating the output signal, and a second or auxiliary multilevel comparator is dedicated for generating a feedback signal. In this way, the signal path through the sigma-delta modulator splits upstream of the quantizer, allowing for a diversification of the feedback signal from the output signal.

DETAILED DESCRIPTION OF THE PREFERRED EMBODIMENTS

Figure 3:
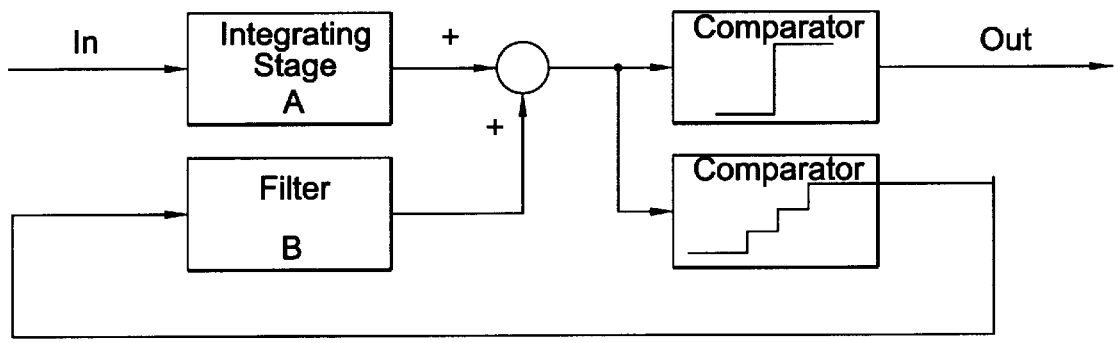
FIG. 3 is a functional block diagram of a sigma-delta modulator, according to the present invention.
Figure 4:
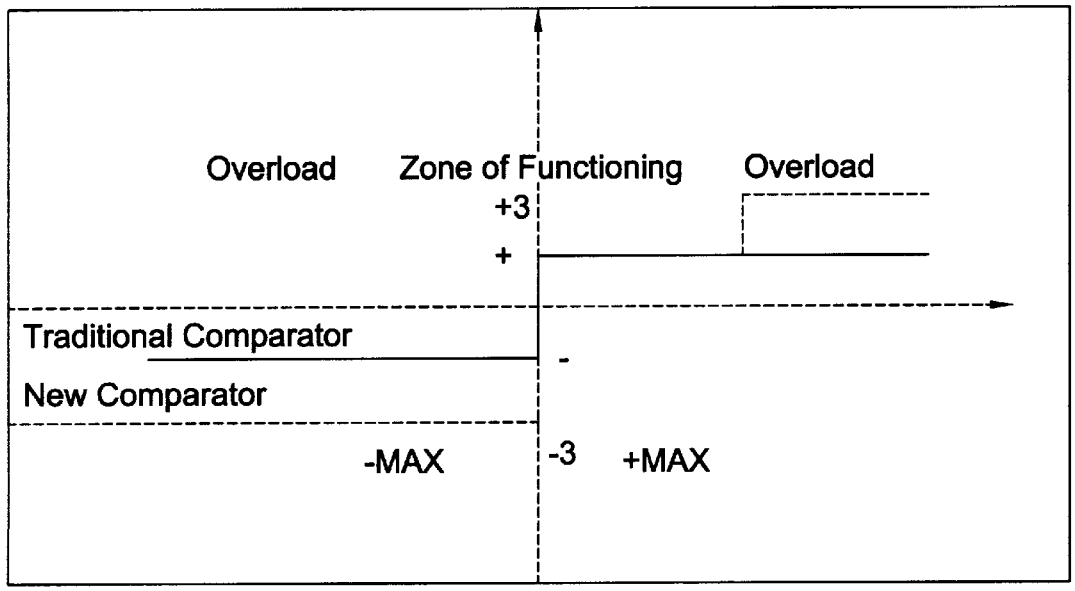
FIG. 4 is a diagram that illustrates the functioning of a sigma-delta modulator in conditions of inherent stability, according to the present invention.

A basic functioning scheme of the sigma-delta modulator of the present invention of FIG. 3, which uses a second, multilevel comparator for producing a logic feedback signal, is depicted in FIG. 4. This is provided for comparison purposes with the scheme of FIG. 1 showing a modulator according to the prior art.

Figure 1:
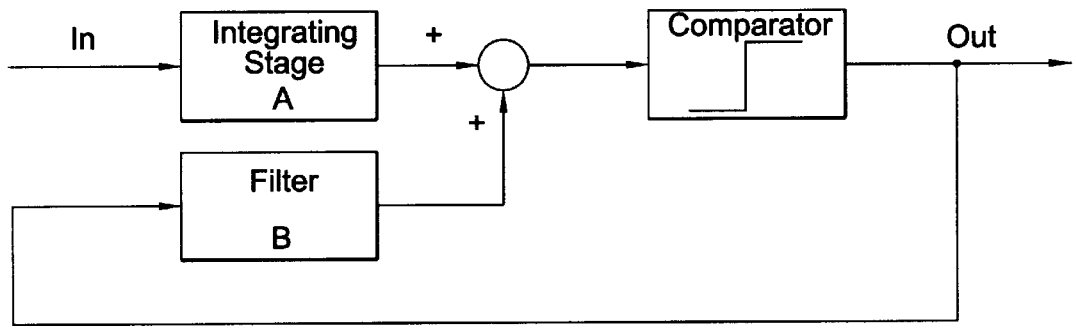
FIG. 1 represents the basic functional scheme of a sigma-delta modulator, according to the prior art.
Figure 2:
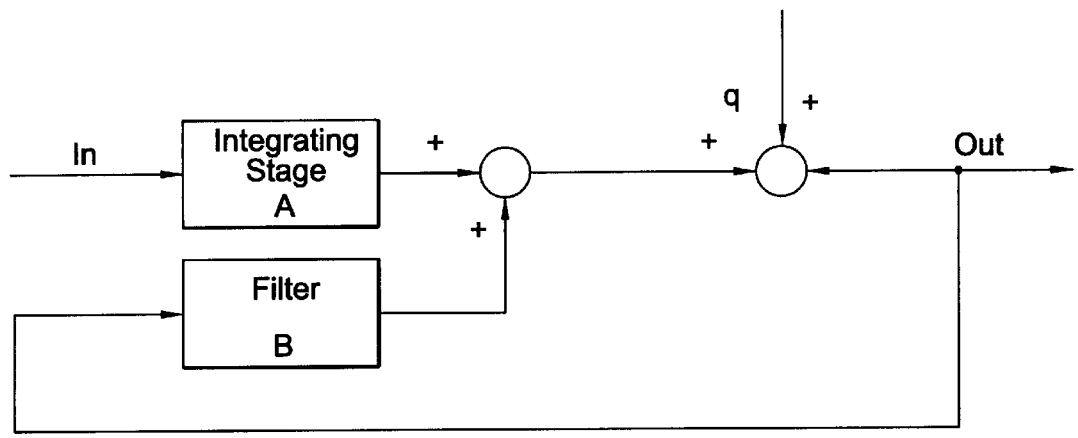
FIG. 2 is an equivalent scheme of a sigma-delta modulator, according to the prior art.

In the prior art sigma-delta modulator of FIG. 1, the single level comparator Comp outputs the value +1 when the input signal is positive regardless of its absolute value, and the value −1 when the input signal is negative sign. In the sigma-delta modulator shown in FIG. 3, the second comparator Comp2 follows exactly the behavior of the first comparator for input signal values having a certain interval. For values outside the interval, the output level is +/−3 as shown in FIG. 4, according to the considered embodiment.

This has no consequence as long as the input signal remains within the fixed limits of amplitude. In this normal operation zone, the sigma-delta modulator of the present invention operates exactly as a normal modulator of the prior art. In contrast, when the input signal to the comparator exceeds a certain threshold, which occurs only in conditions approaching those of instability, the output goes to a higher level. This increases the loop gain and the feedback signal becomes multi-bits, e.g., a 2 bit signal.

In the embodiment considered, the logic levels +3 and −3 are so chosen for making the comparator as linear as possible. Simulation test have demonstrated that these levels minimize the noise in a condition of overload. This simple modification provides an unconditioned stability that may be easily verified by testing under the same conditions the prior art system shown in FIG. 1 and the system of the present invention shown in FIG. 3.

In all cases where the input signal generates instability in the prior art system, the system of the present invention responds without introducing instability. The only negative consequence is a limited degradation of the output signal-to-noise ratio. This occurs because in a condition of overload, the output signal and the feedback signal are different from each other, and therefore, the noise is no longer correctly compensated. However, the degradation of the signal-to-noise is substantially negligible when compared to the degradation that occurs when using traditional stabilizing approaches.

An advantage of the sigma-delta modulator of the present invention is that it operates better than conventional circuits. This improved performance is obtained with a very simple structure that effectively substitutes in its function the far more complex external controller commonly used in the known systems. Accordingly, the present invention significantly reduces costs.

A further advantage of the self-stabilizing method of the present invention is the possibility to deliberately design the sigma-delta modulator to enter an overload zone when the input signal is dynamically at its a maximum value. In this case, at the consequence of a minor degradation in the signal-to-noise ratio, it is possible to fully exploit the available dynamic range of the input signal on the analog voltages. Such a compromise becomes particularly advantageous in converting power, where it is important to maximize the power that may be delivered for the same supply voltage and where the degradation caused by the digital part is amply masked by the distortion which is unavoidably introduced by the analog stage of the converter.

That which is claimed is:

1. A sigma-delta modulator comprising:
   at least two integrating stages connected together;
   a first comparator connected to an output of a last integrating stage of said at least two integrating stages, said first comparator generating a signal having a first logic level when an input signal is positive and generating a signal having a second logic value when the input signal is negative, regardless of an absolute value of the input signal;
   a second comparator having an input connected in common to an input of said first comparator, said second comparator generating an output signal having a positive logic value when the input signal is positive and generating an output signal having a negative logic value when the input signal is negative, and the output signal having an increasing logic level when the input signal exceeds one or more predefined thresholds of increasing value;
   a filter connected to an output of said second comparator; and
   an adder connected to an output of said filter and between the last integrating stage of said at least two integrating stages and said first comparator, said filter and said second comparator forming a feedback path with said adder for adding a feedback signal filtered by said filter to the output signal provided by the last integrating stage.

2. A sigma-delta modulator according to claim 1, wherein said filter comprises a low-pass filter.

3. A sigma-delta modulator according to claim 1, wherein the first logic level is a +1 and the second logic level is a −1.

4. A sigma-delta modulator according to claim 1, wherein said first comparator is a one-bit comparator.

5. A sigma-delta modulator according to claim 1, wherein said second comparator operates the same as said first comparator when the input signal is a value within a predefined interval.

6. A sigma-delta modulator according to claim 1, wherein said second comparator generates an output signal having a third logic level when the input signal is a positive value outside a predefined interval and generates an output signal having a fourth logic level when the input signal is a negative value outside the predefined interval.

7. A sigma-delta modulator according to claim 6, wherein the third logic level is a +3 and the fourth logic level is a −3.

8. A sigma-delta modulator comprising:
   at least two integrating stages;
   a first comparator connected to an output of a last integrating stage of said at least two integrating stages;
   a second multilevel comparator having an input connected in common to an input of said first comparator;
   a filter connected to an output of said second multilevel comparator; and
   an adder circuit connected to an output of said filter and between the last integrating stage of said at least two integrating stages and said first comparator, said filter and said second multilevel comparator forming a feedback path with said adder circuit for adding a feedback signal filtered by said filter to the output signal provided by the last integrating stage.

9. A sigma-delta modulator according to claim 8, wherein said second multilevel comparator generates an output signal having a positive logic value when an input signal is positive and generates an output signal having a negative logic value when the input signal is negative.

10. A sigma-delta modulator according to claim 9, wherein said second comparator generates the output signal having an increasing logic level when the input signal exceeds one or more predefined thresholds of increasing value.

11. A sigma-delta modulator according to claim 8, wherein said first comparator generates a logic signal having a first logic level when the input signal is positive and generates a logic signal having a second logic value when the input signal is negative, regardless of an absolute value of the input signal.

12. A sigma-delta modulator according to claim 11, wherein the first logic level is a +1 and the second logic level is a −1.

13. A sigma-delta modulator according to claim 8, wherein said filter comprises a low-pass filter.

14. A sigma-delta modulator according to claim 8, wherein said first comparator is a one-bit comparator.

15. A sigma-delta modulator according to claim 8, wherein said second multilevel comparator operates the same as said first comparator when the input signal is a value within a predefined interval.

16. A sigma-delta modulator according to claim 8, wherein said second multilevel comparator generates an output signal having a third logic level when the input signal is a positive value outside a predefined interval and generates an out signal having a fourth logic level when the input signal is a negative value outside the predefined interval.

17. A sigma-delta modulator according to claim 16, wherein the third logic level is a +3 and the fourth logic level is a −3.

18. A method for stabilizing a sigma-delta modulator comprising at least two integrating stages, the method comprising the steps of:

generating by a first comparison a signal having a first logic level when an input signal is positive and generating a signal having a second logic value when the input signal is negative, regardless of an absolute value of an input signal;

generating by a second comparison an output signal having a positive logic value when the input signal is positive and a negative logic value when the input signal is negative, and the output signal has an increasing logic level when the input signal exceeds one or more predefined thresholds of increasing value;

filtering the output signal provided by the second comparison; and adding the filtered output signal from the second comparison with the signal output by the first comparator.

19. A method according to claim 18, wherein the step of filtering allows low frequency signals to pass.

20. A method according to claim 18, wherein the first logic level is a +1 and the second logic level is a −1.

21. A method according to claim 18, wherein the first comparison is performed by a one-bit comparator.

22. A method according to claim 18, wherein the second comparison is performed by a multilevel comparator that operates the same as the first comparison when the input signal is a value within a predefined interval.

23. A method according to claim 18, wherein the second comparison generates an output signal having a third logic level when the input signal is a positive value outside a predefined interval and generates an out signal having a fourth logic level when the input signal is a negative value outside the predefined interval.

* * * * *

UNITED STATES PATENT AND TRADEMARK OFFICE
CERTIFICATE OF CORRECTION

PATENT NO. : 6,169,507 B1
DATED : January 2, 2001
INVENTOR(S) : Marco Bianchessi, Sandro Dalle Feste, Nadia Serina, Marco Angelici, Fabio Osnato It is certified that error appears in the above-identified patent and that said Letters Patent is hereby corrected as shown below:

Cover Sheet, Inventors
Delete: "Fabio Osnato, Milan,"
Insert --Fabio Osnato, Milano,--

Column 1, Line 14
Delete: "($\leq 2$)"
Insert --($\geq 2$) --

Column 1, Line 50
Delete: "$\leq 22$."
Insert -- $\geq 2$.--

Claim 5, Line 20
Delete: "an out signal having"
Insert --an output signal having--

Column 6, Line 26
Delete: "an out signal having"
Insert --an output signal having--

Signed and Sealed this

Fifteenth Day of May, 2001

*Attest:*

NICHOLAS P. GODICI

*Attesting Officer*  Acting Director of the United States Patent and Trademark Office